(12) United States Patent
Wirtz et al.

(10) Patent No.: US 8,779,276 B2
(45) Date of Patent: Jul. 15, 2014

(54) THERMOELECTRIC DEVICE

(75) Inventors: Rene Wirtz, Stuttgart (DE); Silvia Rosselli, Stuttgart (DE); Gabriele Nelles, Stuttgart (DE)

(73) Assignee: Sony Corporation, Tokyo (JP)

( * ) Notice: Subject to any disclaimer, the term of this patent is extended or adjusted under 35 U.S.C. 154(b) by 193 days.

(21) Appl. No.: 13/543,209

(22) Filed: Jul. 6, 2012

(65) Prior Publication Data

US 2013/0042899 A1 Feb. 21, 2013

(30) Foreign Application Priority Data

Jul. 14, 2011 (EP) .................................. 11005765

(51) Int. Cl.
*H01L 35/24* (2006.01)
*H01L 35/34* (2006.01)
*H01L 35/02* (2006.01)

(52) U.S. Cl.
USPC ........ 136/236.1; 136/230; 136/205; 136/203; 136/201; 438/54

(58) Field of Classification Search
USPC .......... 136/236.1, 230, 205, 203, 201; 438/54
See application file for complete search history.

(56) References Cited

U.S. PATENT DOCUMENTS

| | | | | | |
|---|---|---|---|---|---|
| 5,168,339 | A | * | 12/1992 | Yokotani et al. ................. | 257/64 |
| 5,507,879 | A | * | 4/1996 | Gyoten et al. ................. | 136/224 |
| 6,096,965 | A | * | 8/2000 | Ghamaty et al. ............... | 136/201 |
| 6,127,619 | A | * | 10/2000 | Xi et al. ......................... | 136/203 |
| 6,232,542 | B1 | * | 5/2001 | Hiraishi et al. ................ | 136/201 |
| 6,441,295 | B2 | * | 8/2002 | Hiraishi et al. ................ | 136/201 |
| 6,441,296 | B2 | * | 8/2002 | Hiraishi et al. ................ | 136/201 |
| 6,677,515 | B2 | * | 1/2004 | Wang et al. .................... | 136/201 |
| 6,696,635 | B2 | * | 2/2004 | Prasher ......................... | 136/201 |
| 6,759,586 | B2 | * | 7/2004 | Shutoh et al. ................. | 136/205 |
| 6,833,083 | B2 | * | 12/2004 | Imai et al. ................. | 252/62.3 T |
| 6,858,154 | B2 | * | 2/2005 | Suzuki et al. ............ | 252/62.3 R |
| 6,914,343 | B2 | * | 7/2005 | Hiller et al. ..................... | 290/43 |
| 2001/0001960 | A1 | * | 5/2001 | Hiraishi et al. ................ | 136/201 |
| 2001/0001961 | A1 | * | 5/2001 | Hiraishi et al. ................ | 136/201 |
| 2003/0111660 | A1 | * | 6/2003 | Ghamaty et al. ................. | 257/15 |
| 2003/0230332 | A1 | * | 12/2003 | Venkatasubramanian et al. ............................. | 136/205 |
| 2004/0238022 | A1 | * | 12/2004 | Hiller et al. ................... | 136/203 |
| 2005/0150536 | A1 | * | 7/2005 | Ngai et al. ..................... | 136/201 |
| 2005/0150537 | A1 | * | 7/2005 | Ghoshal ........................ | 136/205 |
| 2005/0150539 | A1 | * | 7/2005 | Ghoshal et al. ............... | 136/205 |

* cited by examiner

*Primary Examiner* — Golam Mowla
(74) *Attorney, Agent, or Firm* — Oblon, Spivak, McClelland, Maier & Neustadt, L.L.P.

(57) ABSTRACT

The present invention relates to a thermoelectric device, in particular an all-organic thermoelectric device, and to an array of such thermoelectric devices. Furthermore, the present invention relates to a method of manufacturing a thermoelectric device, in particular an all-organic thermoelectric device. Moreover, the present invention relates to uses of the thermoelectric device and/or the array in accordance with the present invention.

20 Claims, 7 Drawing Sheets

(6 of 7 Drawing Sheet(s) Filed in Color)

- P-type: 940μl PEDOT:PSS (PH1000) & 60μl ethylene glycol
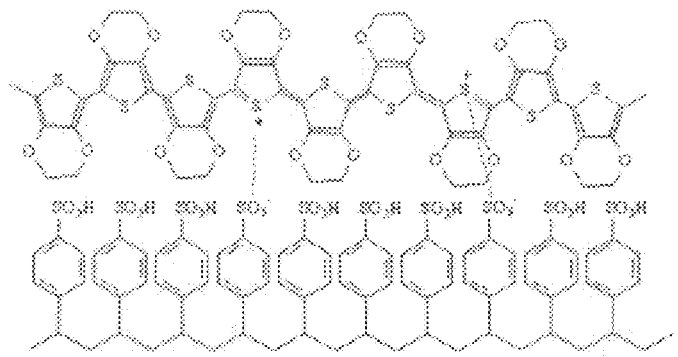
- N-type: 1ml dichloromethane & 25mg polystyrene & 25mg TTF:TCNQ
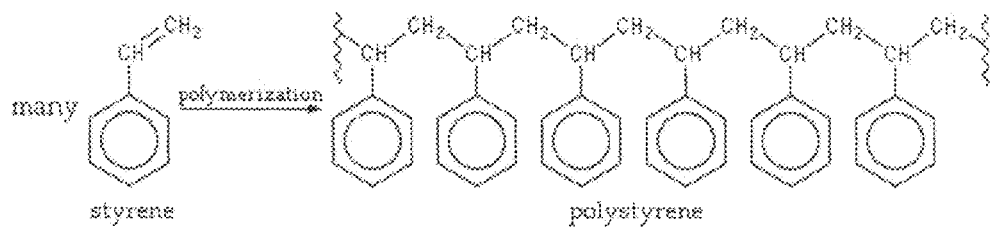
+
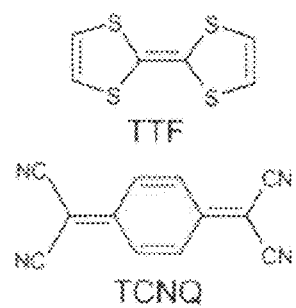
Figure 6

THERMOELECTRIC DEVICE

CROSS-REFERENCE TO RELATED APPLICATIONS

The present application claims priority to and incorporates by reference the entire contents of European Patent Application No. 11 005 765.0 filed on Jul. 14, 2011.

BACKGROUND OF THE INVENTION

The present invention relates to a thermoelectric device, in particular an all-organic thermoelectric device, and to an array of such thermoelectric devices. Furthermore, the present invention relates to a method of manufacturing a thermoelectric device, in particular an all-organic thermoelectric device. Moreover, the present invention relates to uses of the thermoelectric device and/or the array in accordance with the present invention.

State of the art thermoelectric devices, i.e. thermogenerators and Peltier elements, are made of inorganic semiconductors, mostly based on bismuth and tellurium. While these materials have large advantages as superior efficiency or high output voltages, they also show several disadvantages. They are expensive, belong to the group of heavy metals, with all the environmental problems associated therewith, are rigid and brittle, and are therefore somewhat difficult to process and to manipulate. Moreover, metal pads are needed in order to contact the inorganic semiconductors from the outside in thermogenerators and Peltier elements made thereof. Accordingly, it was an object of the present invention to provide for a thermoelectric device that avoids the problems associated with the prior art devices. More particularly, it was an object of the present invention to provide for a thermoelectric device that is easy to manufacture and that allows the adaptation of simple manufacturing processes. It was furthermore an object of the present invention to provide for a thermoelectric device that avoids the use of heavy metals.

BRIEF SUMMARY OF THE INVENTION

All these objects are solved by a thermoelectric device, comprising:
a first substrate and a second substrate,
and a plurality of pairs of semiconducting members sandwiched between said first and second substrate,
each pair of semiconducting members consisting of an electron conducting member and of a hole conducting member, wherein said electron conducting member and said hole conducting member are made of an organic n-type semiconducting material and an organic p-type semiconducting material, respectively, wherein, in each pair, said electron conducting member and said hole conducting member contact each other,
wherein on said first substrate, a first subset of said plurality of pairs of semiconducting members are arranged in a first pattern such that said pairs are spaced apart from each other by a first set of gaps between said pairs on said first substrate, and
wherein on said second substrate, a second subset of said plurality of pairs of semiconducting members are arranged in a second pattern such that said pairs are spaced apart from each other by a second set of gaps between said pairs on said second substrate,
wherein said first pattern and said second pattern are complementary to each other, such that, when said first and second substrates are arranged opposite each other with said first and second subsets facing each other, electrical contacts between neighboring pairs of said first subset are established by pairs of said second subset, and electrical contacts between neighboring pairs of said second subset are established by pairs of said first subset.

In one embodiment, said first subset of said plurality of pairs fills said second set of gaps, and said second subset of said plurality of pairs fills said first set of gaps, and wherein said first subset of said plurality of pairs physically contacts said second subset of said plurality of pairs, and wherein each physical contact is established by electron conducting members of said first subset physically contacting electron conducting members of said second subset only and by hole conducting members of said first subset physically conducting hole conducting members of said second subset only.

In one embodiment, electrical contacts between neighboring pairs of said first subset and electrical contacts between neighboring pairs of said second subset are established without metal contacts or metal electrodes.

In one embodiment, said organic n-type semiconducting material and said organic p-type semiconducting material are organic polymers.

In one embodiment, said organic n-type semiconducting material is independently, at each occurrence in each pair, selected from organic polymers doped with electron donors, and charge transfer complexes.

In one embodiment, said organic p-type semiconducting material is independently, at each occurrence in each pair, selected from organic polymers doped with electron acceptors.

In one embodiment, the first and second substrates are made of a material independently at each occurrence selected from insulating materials, such as glass, plastics, paper.

In one embodiment, the first and second substrates are not rigid, but flexible and can, as such, preferably, be rolled, such that they are amenable to roll-to-roll-manufacturing processes.

In one embodiment, the thermoelectric device according to the present invention has at least two points for making electrical contacts to a power supply or for connecting the thermoelectric device to another electrical or thermoelectric device.

The objects of the present invention are also solved by an array of thermoelectric devices as defined above, wherein a plurality of thermoelectric devices according to any of the foregoing claims are electrically connected in series with each other and are arranged such that their respective first substrates all face in one direction, and their respective second substrates all face in the opposite direction.

In one embodiment, the array according to the present invention is located in a housing.

The objects of the present invention are also solved by a method of manufacturing a device according to the present invention, said method comprising the steps:
providing a first and a second substrate,
applying a first subset of a plurality of pairs of semiconducting members onto said first substrate in a first pattern such that said pairs in said first subset are spaced apart from each other by a first set of gaps between said pairs on said first substrate, and
applying a second subset of said plurality of pairs of semiconducting members onto said second substrate in a second pattern such that said pairs in said second subset are spaced apart from each other by a second set of gaps between said pairs on said second substrate,
wherein said first pattern and said second pattern are complementary to each other, such that when said first and second substrates are arranged opposite each other with said first and second subsets facing each other, electrical contacts between neighboring pairs of said first subset are established by pairs of said second subset, and electrical contacts between neighboring pairs of said second subset are established by pairs of said first subset, assembling and bonding the first and second substrates together, with said first and second subsets of said plurality of pairs of semiconducting members facing each other.

"Bonding" substrates together may be achieved by any means suitable and known to a person skilled in the art, e.g. by gluing the substrates together, pressing the substrates together at an elevated temperature, or joining them together by other means such as clamp(s) etc.

In one embodiment, said pairs of semiconducting members, said electron conducting members, said hole conducting members, said first subset, said second subset, said first set of gaps and said second set of gaps, said first substrate and said second substrate are as defined above.

In one embodiment, the applying steps occur by printing or vapor depositing.

The objects of the present invention are also solved by the use of a device according to the present invention or of an array according to the present invention for generating a voltage or a heat gradient, wherein preferably, the device or array is incorporated in an electronic device, in a medical device, such as a sensor or a band aid, in clothing, in wall paper, in a laboratory device, such as a thermocycler. For example, it may be used to generate a voltage for a sensor or for a medical device, e.g. a band-aid.

The present inventors have found that it is possible to produce an all-organic thermoelectric device, wherein the semiconducting components are made from all-organic components. The term "all-organic", as used herein, is meant to refer to compounds which are carbon-based. In one embodiment, the term "all-organic" refers to the exclusive use of carbon-based polymers.

The term "contact" may refer to an interaction, whereby an electrical contact or a physical contact is established. An "electrical contact", as used herein, is a contact that allows the flow of electrons between the two entities electrically contacting each other. A "physical contact", as used herein, is meant to refer to a scenario wherein the two entities actually touch each other. The unspecified term "contact" may mean any type of contact, for example an electrical contact or a physical contact.

The inventors have devised a method by which pairs of semiconducting members are applied to the surface of a substrate, wherein each such pair consists of an electron conducting member and of a hole conducting member. The two members contact each other, wherein, preferably, such contact is physical, in the sense that they actually touch each other. Applying such pairs on one substrate in a first defined pattern, with gaps in between the pairs, and by applying a complementary pattern of pairs on a second substrate, it is possible to provide for a layer of pairs of semiconducting members sandwiched between the first and the second substrate, wherein the two subsets of pairs of semiconducting members engage with each other and form an array of n-type semiconducting components and p-type semiconducting components, which array can be used to function as a heat pump, upon application of a voltage thereto.

Metal bridges are avoided in this setup, because the electrical contacts are established via the complementary pairs of semiconducting members on opposite substrates. Likewise, inorganic semiconductors, such as bismuth and tellurium, are also avoided. Since the semiconducting members are made of organic materials, in particular organic polymers, they can be applied by a variety of application processes, in particular printing and vapor depositing. This makes the present invention particularly amenable to large area (>1 m$^2$) applications as well as applications on flexible substrates, which are not rigid, but which can be rolled up and are amenable to roll-to-roll-manufacturing processes. The present invention envisages also an array of such thermoelectric devices within a Peltier element, wherein the thermoelectric devices are connected in series with each other. Such Peltier elements may have additional features, such as a heat sink etc.

The present invention also relates to a method of manufacturing, wherein the pairs of semiconducting members are applied to two different substrates in complementary patterns, such that these two patterns on the opposite substrates may engage with each other and may thus establish electrical contact or contactability. In preferred embodiments, the respective application steps occur by printing methods or vapor deposition methods, such as thermal evaporation. The devices and arrays in accordance with the present invention can be scaled up to very large sizes (i.e. >1 m$^2$), they can be made using flexible substrates, and they can be used in a wide range of applications, for example in medical applications, such as for the generation of electrical energy generated by body heat to power medical sensors or in heating/cooling band aids, for lifestyle products, for example in actively heating/cooling clothing, for building infrastructures, for example generating electrical energy for sensors based on air conditioning systems or heating/cooling wall papers, or in electric devices, where already now those typically thermoelectric devices, such as Peltier elements are used.

The present invention has the advantage that the thermogenerators in accordance with the invention are simple and easy to produce. The expected costs are low, because of cheap materials and amenable production steps being used. Toxic or harmful materials, such as heavy metals, can be avoided altogether. The process can be scaled up, and flexible substrates can be used, thereby widening the possible applications enormously.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the following, reference is made to the figures, wherein

FIG. 6 shows the P-type and N-type semiconducting materials that are used in the prototype.

DETAILED DESCRIPTION OF THE INVENTION

Moreover, reference is made to the following examples, which are given to illustrate, not to limit the present invention.

EXAMPLES

Example 1

Figure 1:
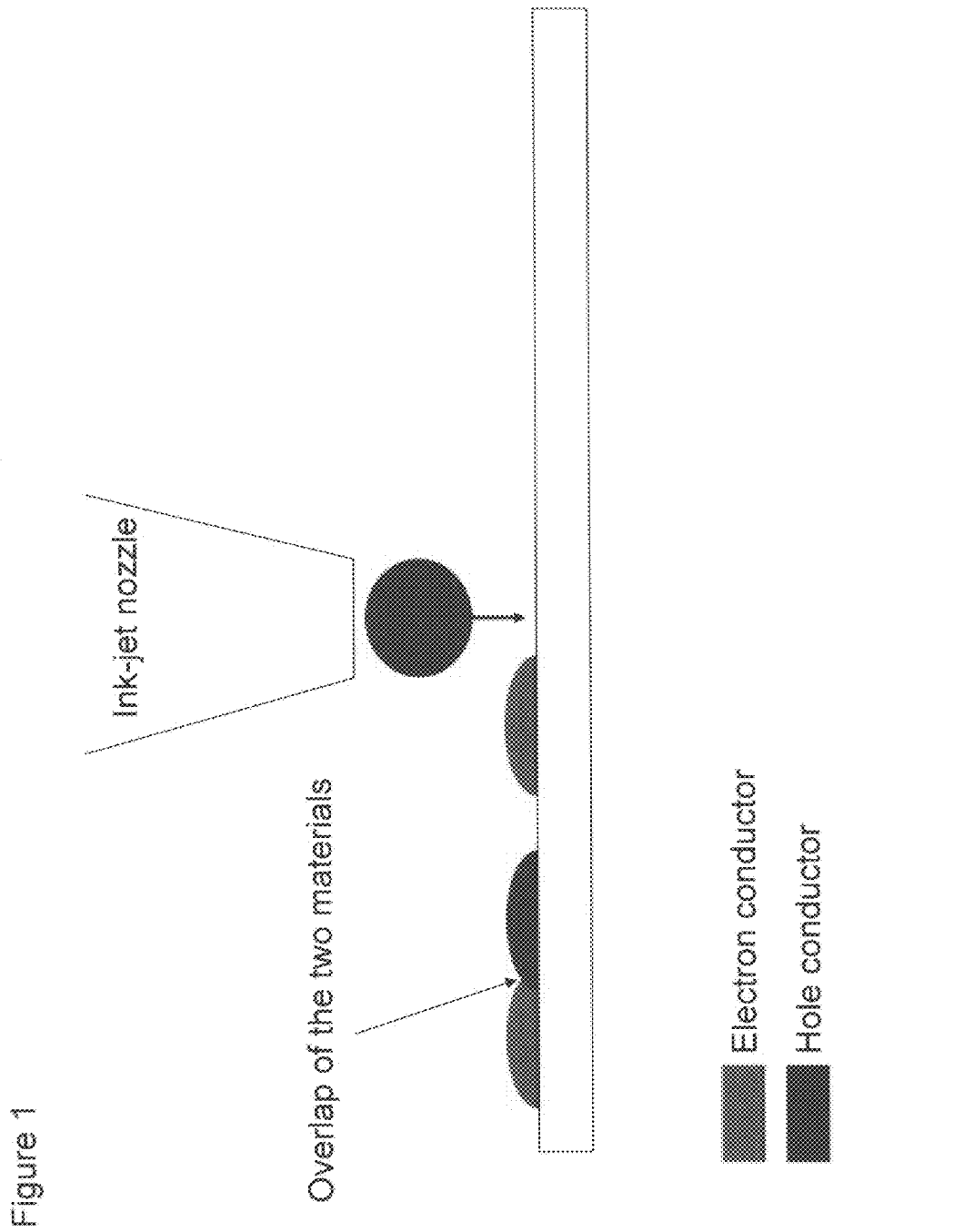
FIG. 1 shows an example of the application of an electron conductor and hole conductor on a substrate, using an inject printer and applying pairs of semiconducting members spaced apart.
Figure 2:
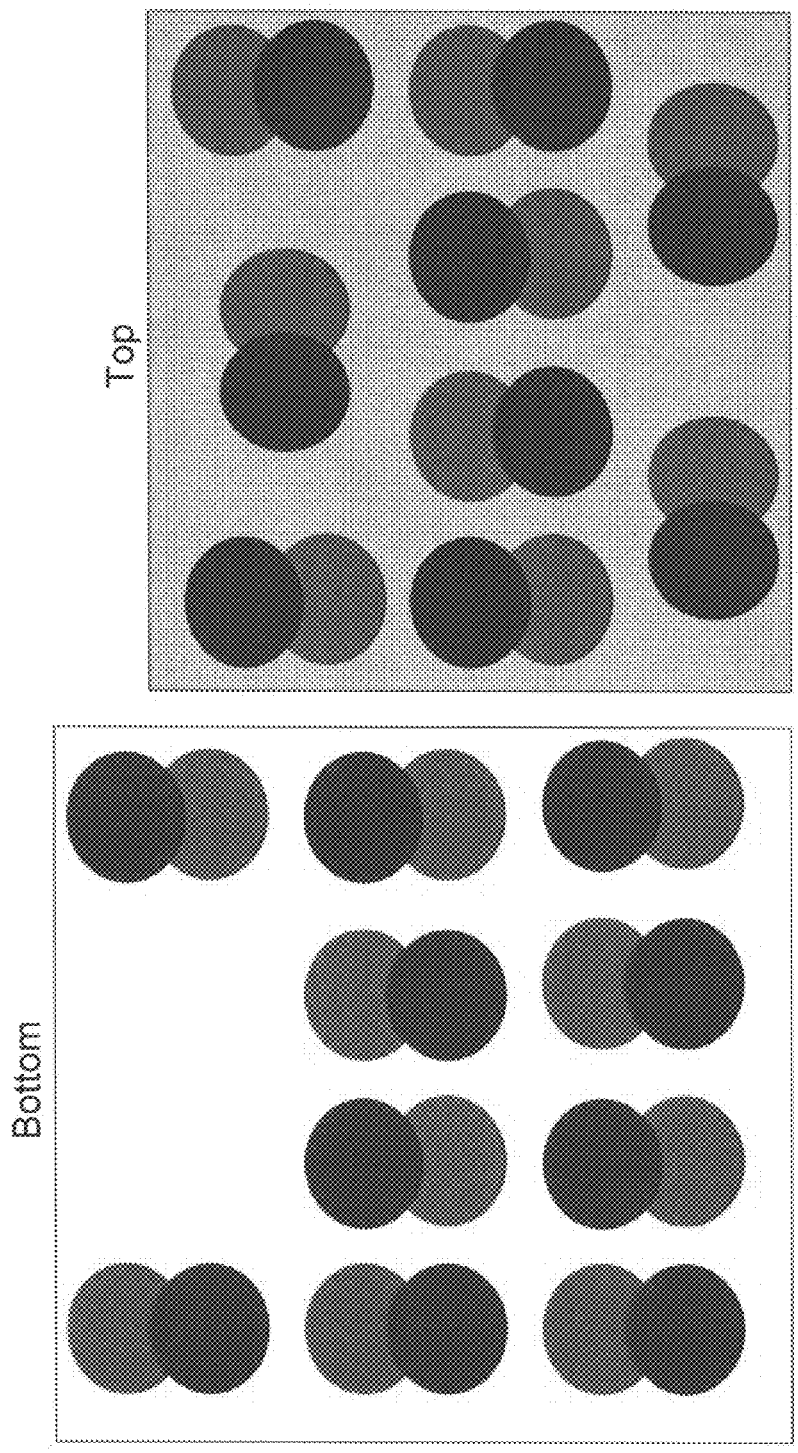
FIG. 2 shows the two complementary patterns applied on two substrates which are to be combined.
Figure 3:
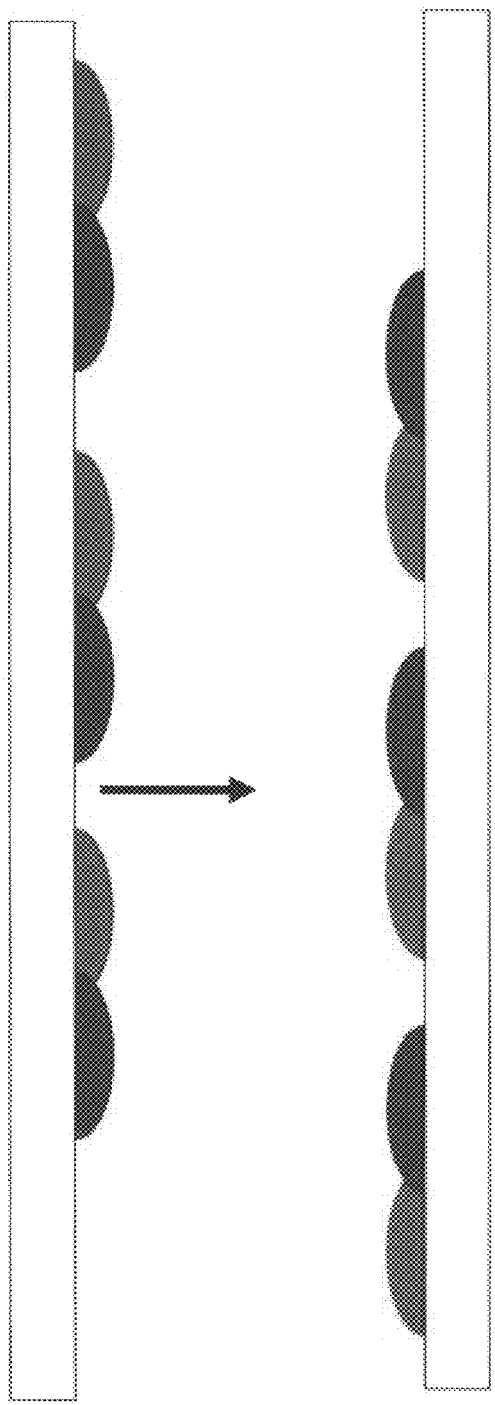
FIG. 3 shows a cross-section of the two substrates of FIG. 2 before they are assembled together showing that the respective patterns bridge the respective gaps in the respective other pattern.
Figure 4:
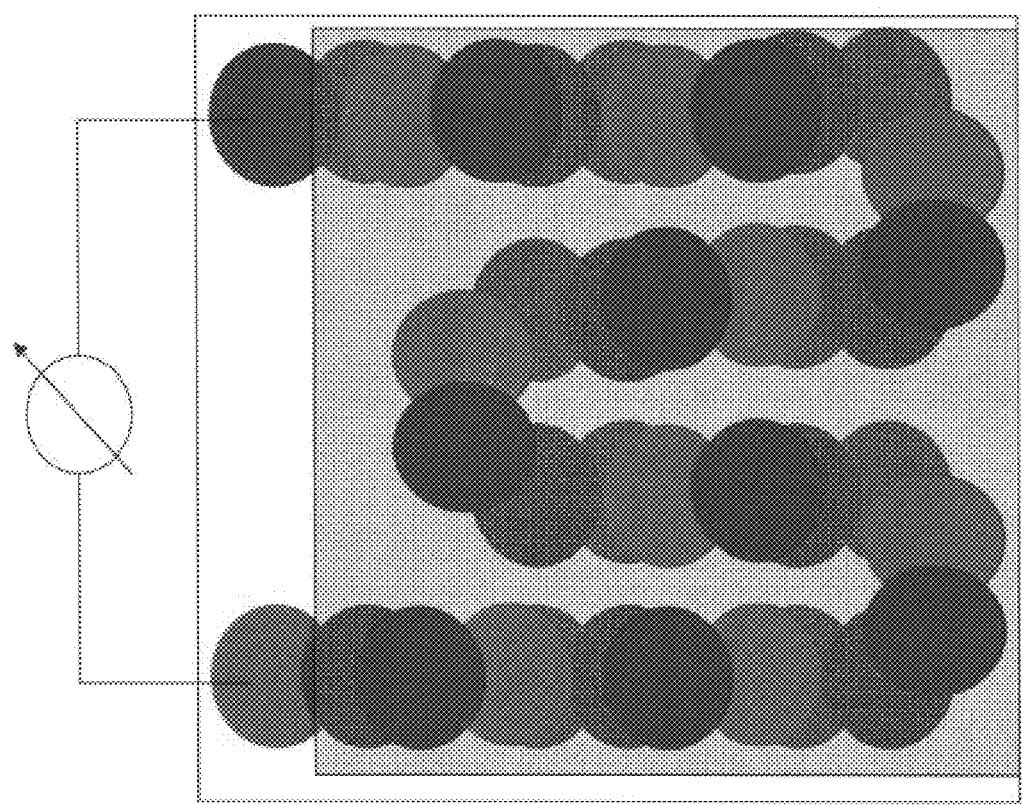
FIG. 4 shows the two substrates brought together with the two patterns combined.
Figure 5:
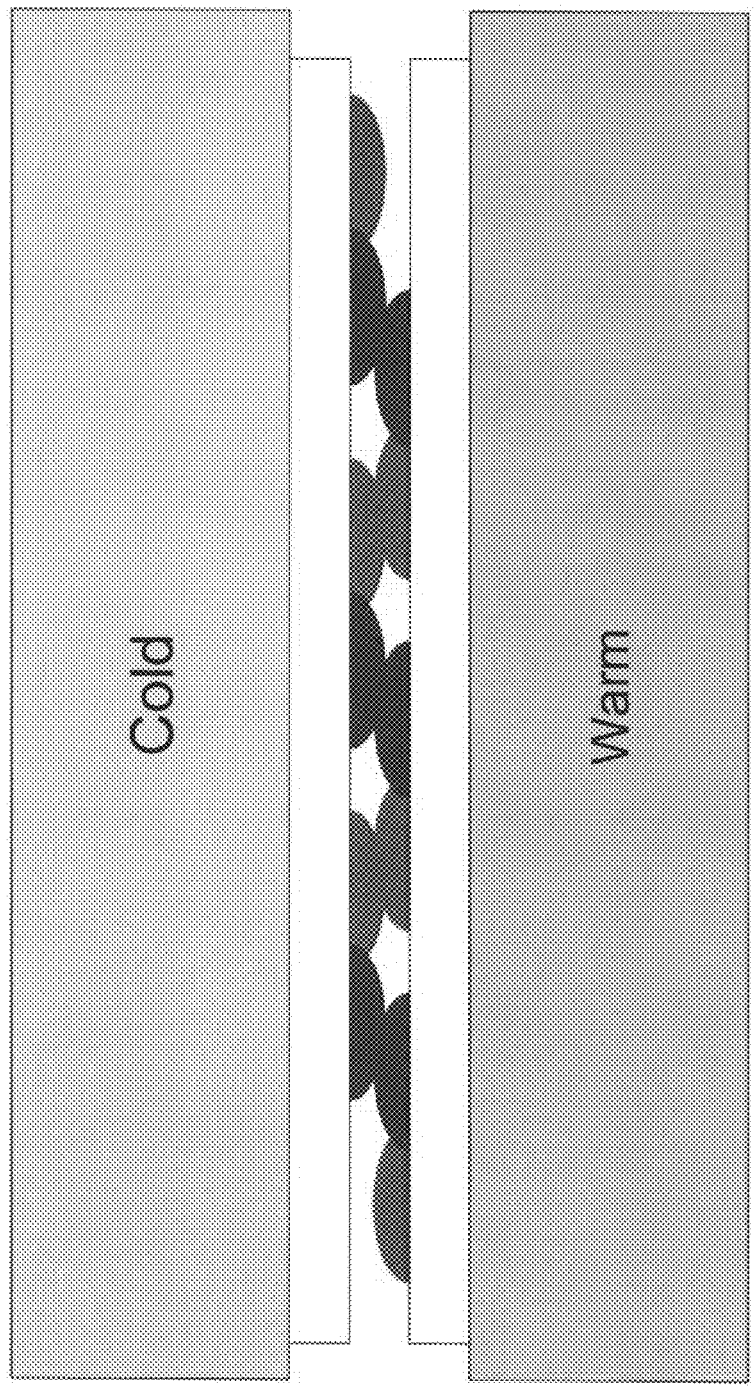
FIG. 5 shows a cross-section of FIG. 4 and the effect that may be achieved thereby when an electrical voltage is applied.

An embodiment of the process is depicted in FIGS. 1 to 5. Two substrates need to be coated with hole and electron conducting organic material (for example using a solution-based ink-jet printer as depicted in FIG. 1, but any other printing technique or thermal evaporation can be used as well). The two substrates need to have a complementary design, for example the ones depicted in FIG. 2. FIG. 3 illustrates how the two complementary top and bottom substrates are brought together to build a single device. The same is illustrated in FIG. 4 for the design of FIG. 2 after the two halfs have been brought together (top view). The two electron and hole conducting regions on the bottom substrate that protrude out beyond the top substrate are used as contacts to either collect the generated electrical voltage (thermogenerator) or to apply the external voltage (Peltier element). FIG. 5 shows the final usage of the device. It either acts as a thermogenerator, i.e. it produces electrical energy out of an external heat gradient, or it can be used as a Peltier element, i.e. it converts applied electric energy into a heat gradient, so the device can be used for heating or cooling purposes. As can bee seen the whole process is a simple two step process, consisting of just printing the organic material and assembling the two halfs (top and bottom) together. This is far superior to any state of the art process of producing a thermogenerator or a Peltier element. In addition the process can easily be scaled up to huge dimensions, only limited by the printable substrate size. (For example when using a roll to roll printing process with combined assembling of the two halfs into one device.)

Example 2

Figure 7:
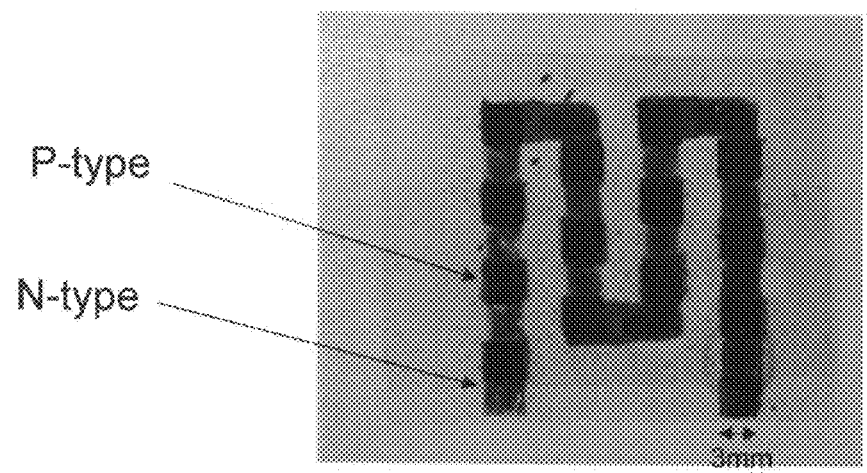
FIG. 7 shows the prototype produced by the present inventors.

In a prototype-production, a thermogenerator was printed using a nano-plotter and a commercial accessory, "Delo-Dot", which is a microdispensing valve (www.venso.se/pdf/delo/delodot.pdf) for printing highly viscous liquids. The exemplary P-type semiconducting material and N-type semiconducting material are shown in FIG. 6. The dimensions to be used for the prototype thermogenerator were as follows:

Dimensions:
Squares: 3×3 mm (16×16 dots, 0.2 mm grid)
Rectangles: 5×3 mm (26×16 dots, 0.2 mm grid)
Gap: 1 mm
Settings of the Delo-Dot:
100V
40 µs
100 Hz
0.5 bar
1 droplet per point
Substrate: HP LaserJet transparency foil (roughly 5×5 cm)
Substrate cleaning: 15 min in UVO-cleaner
Pressed the two substrates together on a hotplate at 120° C. for 15 min using pressure of approximately 800N/m$^2$ The resultant thermogenerator that was thus produced can be seen in FIG. 7.

Example 3

In the following some suitable materials are shown that can be used as organic semiconducting materials of the n-type and p-type. Typically, for these materials organic polymers can be used, which may or may not be doped using electron donors, e.g. phosphorus, to give n-type conduction, or using electron acceptors, e.g. boron, to give p-type conduction.

Suitable polymers include for example poly(3-hexylthiophene) (P3HT), polyaniline, poly(phenylene vinylene)-disperse red 1 (PPV-DR1), polysiloxane carbazole (PSX-Cz), polypyrrole, poly(o-anthranilic acid) (PARA), poly(aniline-co-o-anthranilic acid) (PANI-PARA) and poly(3,4-ethylenedioxythiophene) (PEDOT). The structural formulas of some the above mentioned polymers are shown below:

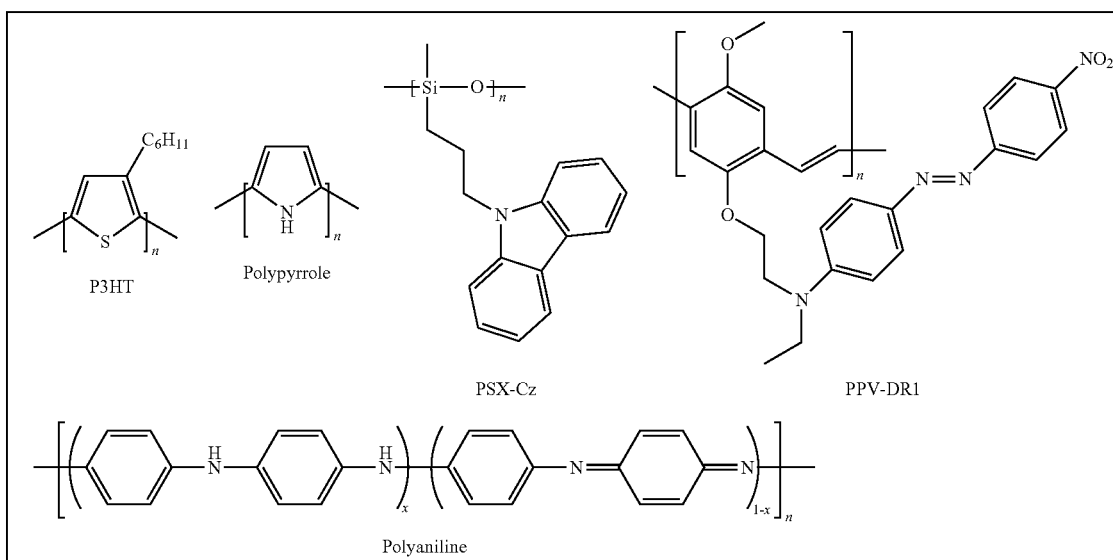

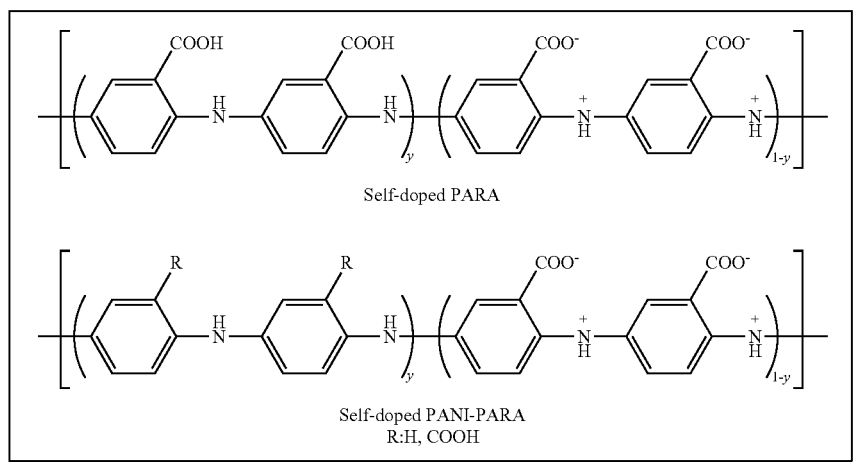

Mixtures of polymers (e.g. PEDOT:PSS or PEDOT:Tos) or copolymers can also be used.

In order to induce charges into the polymer these materials can be doped, using for example electron donors (e.g phosphorous→n-type conduction) or electron acceptors (e.g. boron→p-type conduction). Most polymers are oxidized by air and therefore show p-type conduction in their undoped state.

Likewise, charge transfer complexes may be used.

Charge Transfer Complexes:

Generally and as used herein, these materials referred to as charge-transfer complexes are electron-donor-electron-acceptor complexes that are characterized by at least one electronic transition to an excited state in which there is a partial transfer of an electronic charge from the donor to the acceptor moiety.

Donor and acceptor molecules in the charge transfer complex are so defined that the highest occupied molecule orbital (HOMO) of the donor and the lowest unoccupied molecule orbital (LUMO) of the acceptor are close enough to each other such that upon application of an electric field an electron of the HOMO of the donor can transfer to the LUMO of the acceptor and vice versa depending on the electric field direction.

Donor molecules are molecules that donate electrons during the formation of the charge transfer complex.

Donor molecules can include one or more of the following donor groups without being restricted thereto: $O^-$, $S^-$, $NR_2$, $NAr_2$, NRH, $NH_2$, NHCOR, OR, OH, OCOR, SR, SH, Br, I, Cl, F, R, Ar. They can be single molecules, oligomers or polymers.

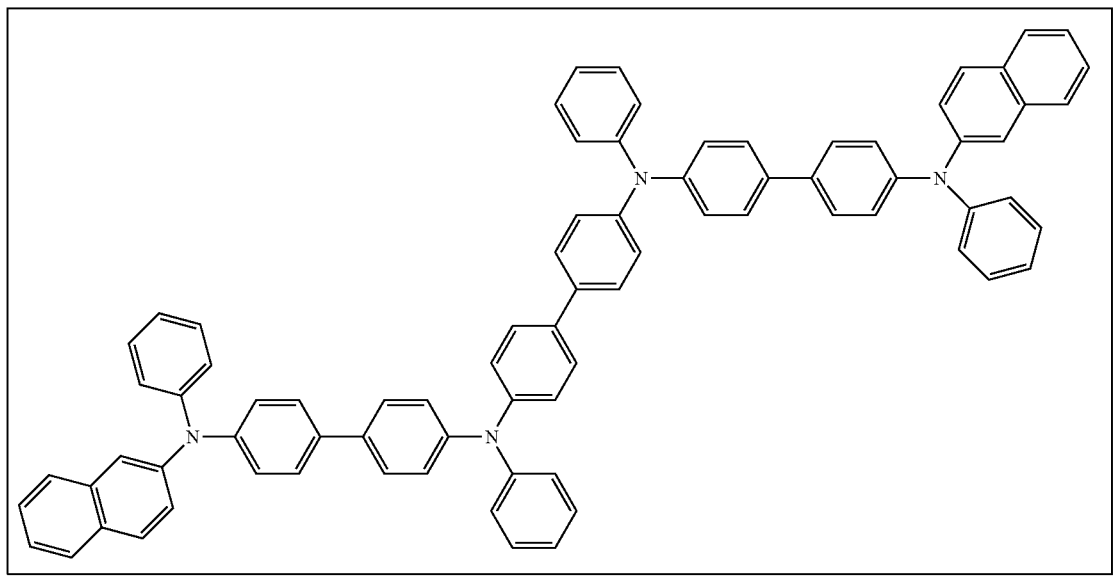

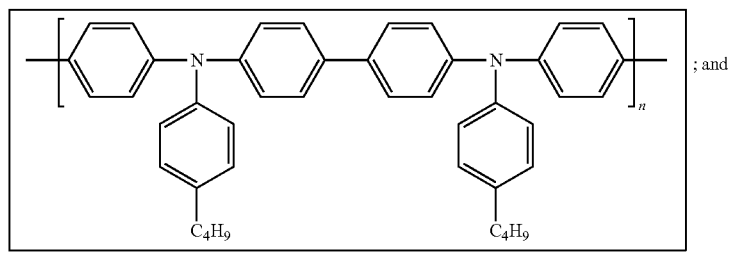

; and

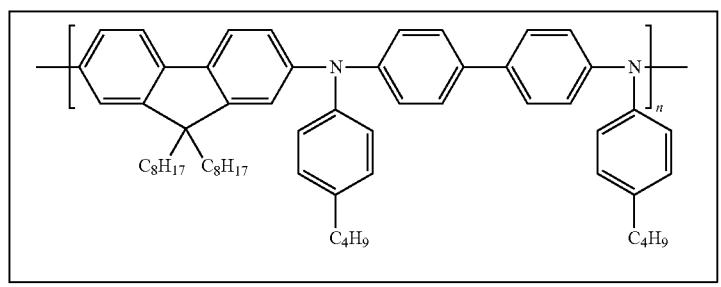

Acceptor molecules are molecules that accept electrons during the formation of a charge transfer complex.

Acceptor molecules can contain one or more of the following acceptor groups without being restricted thereto: $NO_2$, CN, COOH, COOR, $CONH_2$, CONHR, $CONR_2$, CHO, COR, $SO_2R$, $SO_2OR$, NO, Ar. They can be single molecules, oligomers or polymers.

Acceptor molecules are found also among the fullerene derivatives, semiconductor nanodots and electron poor transition metal complexes.

The material can comprise an acceptor molecule of the group comprising C60 fullerene, C61 fullerene, CdSe, and platinum octaethyl porphine.

Alternatively, the material undergoing a charge transfer can be a material having conjugated main-chain as well as side-chain liquid crystalline polymers which can be aligned in mono-domain or multi-domain structures.

The material can have the following formula without being restricted thereto:

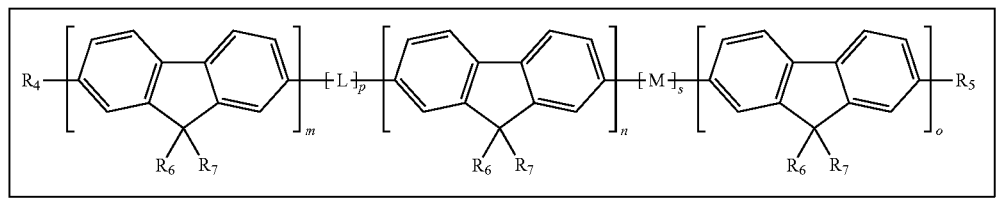

wherein R4 and R5 are independently at each occurrence selected from the group comprising:

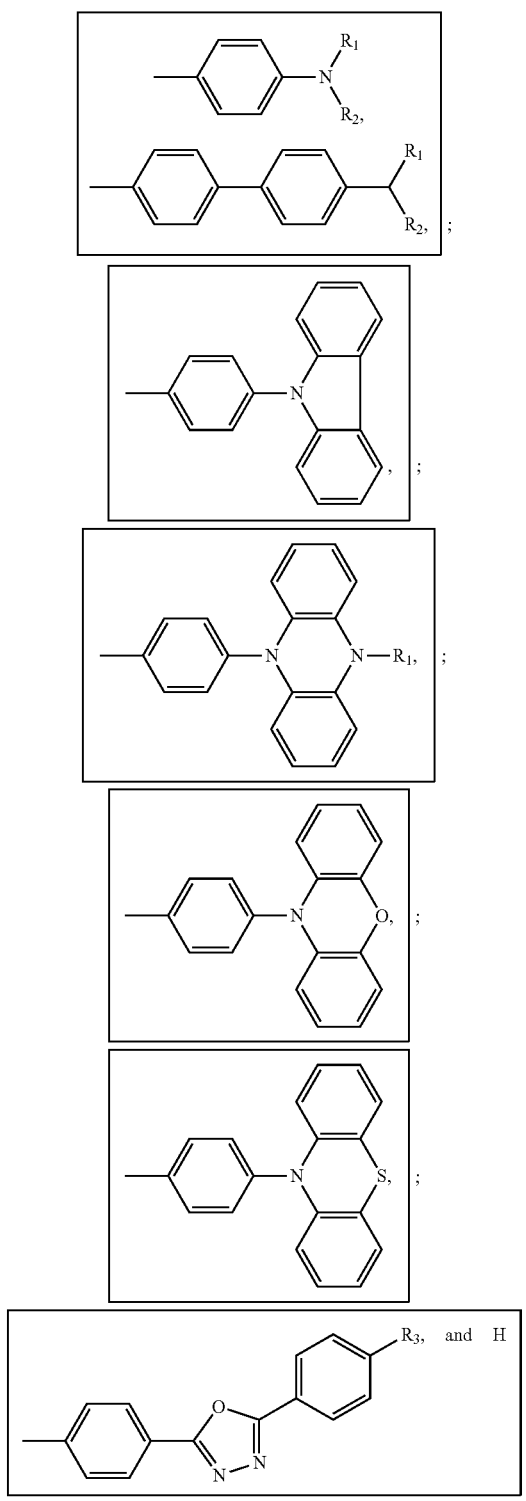

R1 and R2 being independently selected from the group comprising straight chain $C_{1-20}$ alkyl, branched $C_{1-20}$ alkyl, aryl, substituted aryl, alkylaryl, substituted alkylaryl, alkoxyaryl, substituted alkoxyaryl, aryloxyaryl, substituted aryloxyaryl, dialkylaminoaryl, substituted dialkylaminoaryl, diarylaminoaryl and substituted diarylaminoaryl, R3 being selected from the group comprising straight chain $C_{1-20}$ alkyl, branched $C_{1-20}$ alkyl, aryl, substituted aryl, alky- laryl and substituted alkylaryl, and wherein R6 and R7 are independently at each occurrence selected from the group comprising straight chain $C_{1-20}$ alkyl, branched chain $C_{1-20}$ alkyl, aryl, substituted aryl, alkylaryl, substituted alkylaryl, —$(CH_2)_q$—(O—$CH_2$—$CH_2)_r$—O—$CH_3$, q being selected from the range $1<=q<=10$, r being selected from the range $0<=r<=20$, and wherein L and M are independently at each occurrence selected from the group comprising thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $m+n+o<=10$, each of m, n, o being independently selected from the range 1-1,000, and wherein p is selected from the range 0-15, and wherein s is selected from the range 0-15, with the proviso that, if R4 is H, R5 is not H, and if R5 is H, R4 is not H.

Alternatively, the material can have the following formula without being restricted thereto:

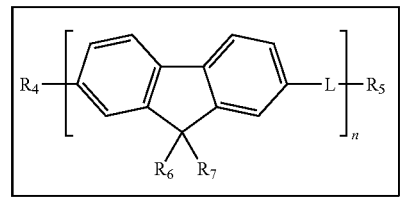

wherein L independently at each occurrence is selected from the group consisting of thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $R_6$ and $R_7$ are independently at each occurrence selected from the group consisting of straight chain $C_{1-20}$, branched chain $C_{1-20}$ alkyl, aryl, substituted aryl alkylaryl, —$(CH_2)_q$—(O—$CH_2$_$CH_2)_r$—O—$CH_3$, q being selected from the range 1-10, r being selected from the range 0-20 and wherein R4 and R5 are independently at each occurrence selected from the group comprising:

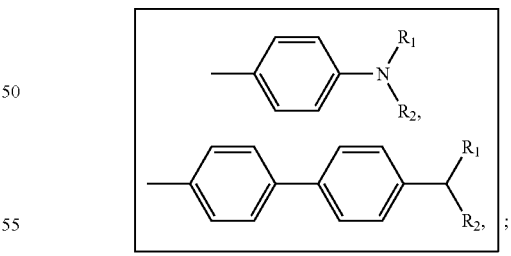

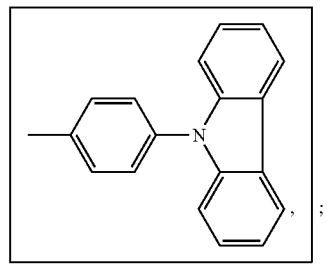

-continued
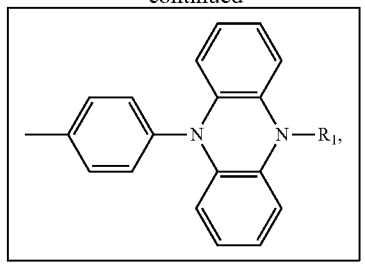;
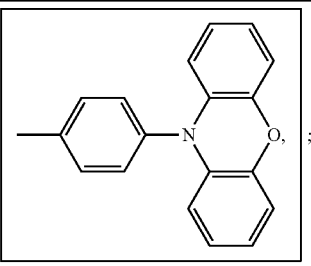;
-continued
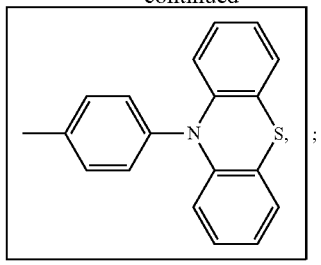; and
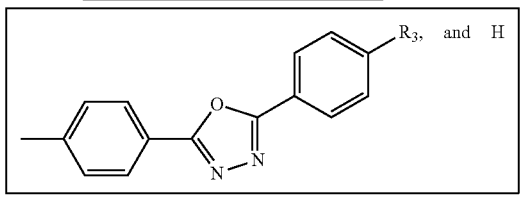
According to another alternative the material can have one of the following formulas without being restricted thereto:
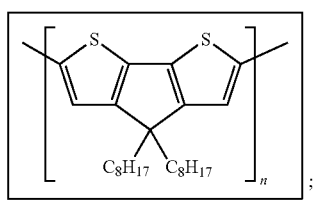;
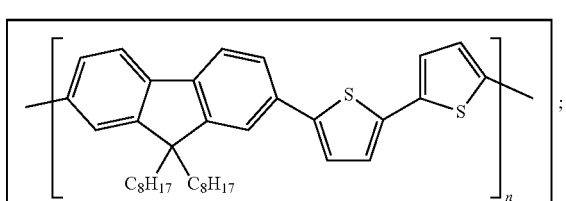;
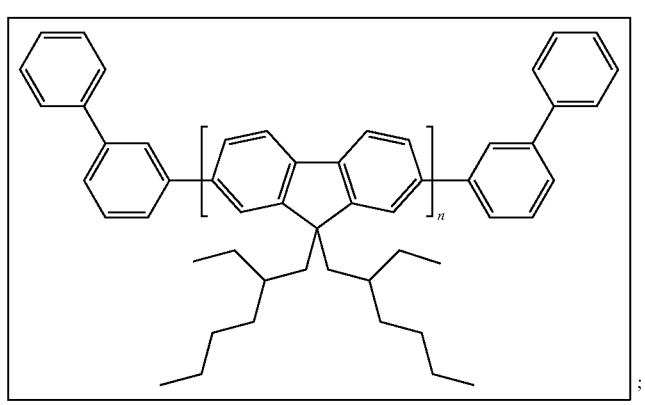;
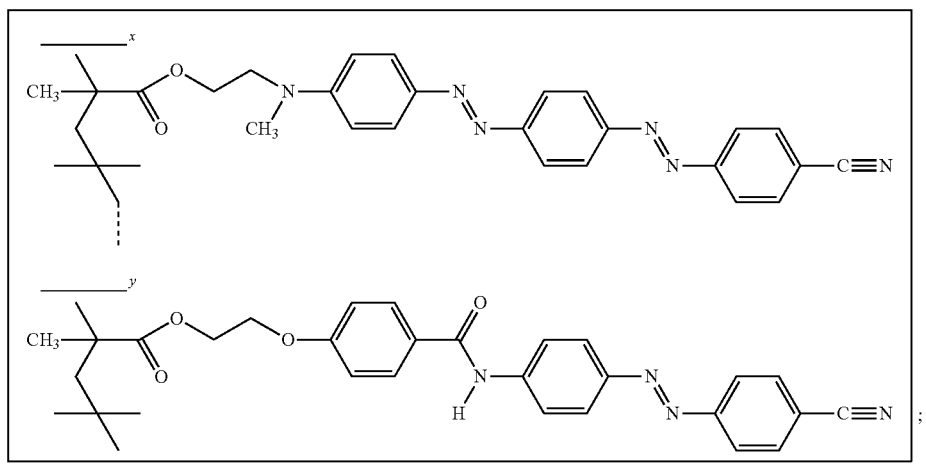; and

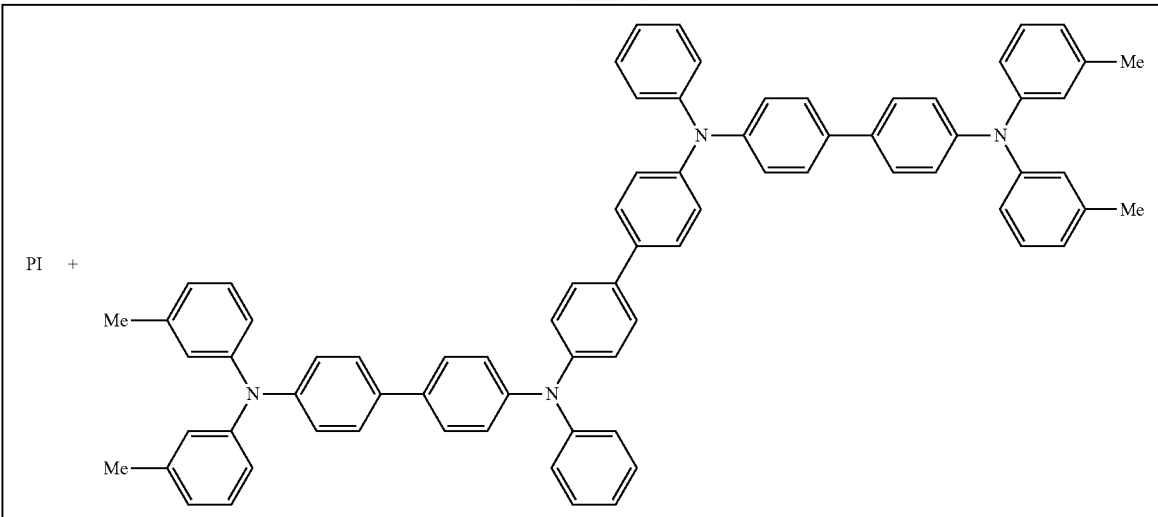

Alternatively, the material can be an endcapped polyfluorene of the formula without being restricted thereto:

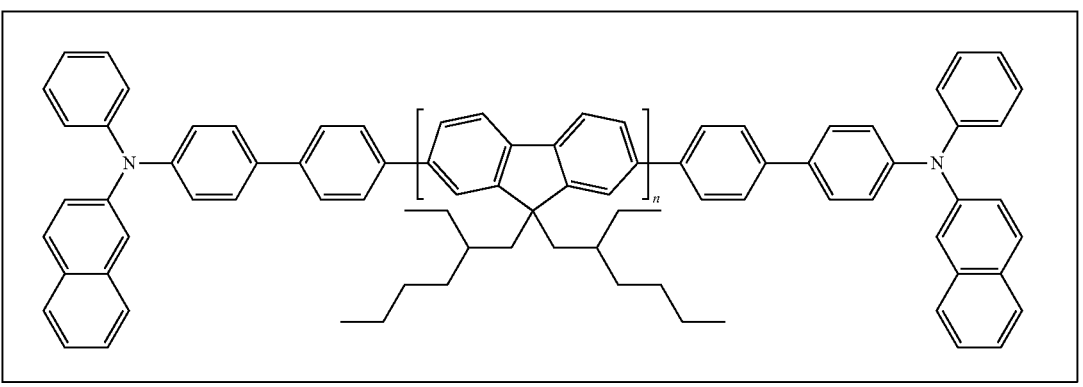

The combination of donor and acceptor regulates the charge conduction properties. N-type conduction can be established using charge transfer complexes. (e.g. 6,6-Phenyl-C61 butyric acid) or tetrathiafulvalene:tetracyanoquinodimethane (TTF:TCNQ) as examples).

The features of the present invention disclosed in the specification, the claims and/or in the accompanying drawings may, both separately and in any combination thereof, be material for realizing the invention in various forms thereof.

The invention claimed is:

1. A thermoelectric device, comprising:
a first substrate and a second substrate, and
a plurality of pairs of semiconducting members sandwiched between said first and second substrate,
each pair of semiconducting members consisting of an electron conducting member and of a hole conducting member, wherein said electron conducting member and said hole conducting member comprise an organic n-type semiconducting material and an organic p-type semiconducting material, respectively, wherein, in each pair, said electron conducting member and said hole conducting member contact each other,
wherein on said first substrate, a first subset of said plurality of pairs of semiconducting members are arranged in a first pattern such that said pairs are spaced apart from each other by a first set of gaps between said pairs on said first substrate, and
wherein on said second substrate, a second subset of said plurality of pairs of semiconducting members are arranged in a second pattern such that said pairs are spaced apart from each other by a second set of gaps between said pairs on said second substrate,
wherein said first pattern and said second pattern are complementary to each other, such that, when said first and second substrates are arranged opposite each other with said first and second subsets facing each other, electrical contacts between neighboring pairs of said first subset are established by pairs of said second subset, and electrical contacts between neighboring pairs of said second subset are established by pairs of said first subset.

2. The thermoelectric device according to claim 1, wherein said first subset of said plurality of pairs fills said second set of gaps, and said second subset of said plurality of pairs fills said first set of gaps,
and wherein said first subset of said plurality of pairs physically contacts said second subset of said plurality of pairs, and wherein each physical contact is established by electron conducting members of said first subset physically contacting electron conducting members of said second subset only and by hole conducting members of said first subset physically contacting hole conducting members of said second subset only.

3. The thermoelectric device according to claim 1, wherein electrical contacts between neighboring pairs of said first subset and electrical contacts between neighboring pairs of said second subset are established without metal contacts or metal electrodes.

4. The thermoelectric device according to claim 1, wherein said organic n-type semiconducting material and said organic p-type semiconducting material are organic polymers.

5. The thermoelectric device according to claim 4, wherein said organic n-type semiconducting material is independently, at each occurrence in each pair, selected from an organic polymer doped with an electron donor, and a charge-transfer complex.

6. The thermoelectric device according to claim 4, wherein said organic p-type semiconducting material is an organic polymer doped with an electron acceptor, optionally a different organic polymer at each occurrence of said organic p-type semiconducting material in each pair.

7. The thermoelectric device according to claim 1, wherein the first and second substrates comprise an insulating material, wherein the insulating material of the first substrate may be different from the insulating material of the second substrate.

8. The thermoelectric device according to claim 7, wherein the first and second substrates are not rigid, but flexible.

9. The thermoelectric device according to claim 1, having at least two points for making electrical contacts to a power supply or for connecting the thermoelectric device to another electrical or thermoelectric device.

10. An array of thermoelectric devices according to claim 1, wherein a plurality of the thermoelectric devices are electrically connected in series with each other and are arranged such that their respective first substrates all face in one direction, and their respective second substrates all face in an opposite direction.

11. The array according to claim 10, located in a housing.

12. A method of manufacturing the device according to claim 1, said method comprising:
(a) applying a first subset of a plurality of pairs of semiconducting members onto a first substrate in a first pattern such that said pairs in said first subset are spaced apart from each other by a first set of gaps between said pairs on said first substrate;
(b) applying a second subset of said plurality of pairs of semiconducting members onto a second substrate in a second pattern such that said pairs in said second subset are spaced apart from each other by a second set of gaps between said pairs on said second substrate,
wherein said first pattern and said second pattern are complementary to each other, such that when said first and second substrates are arranged opposite each other with said first and second subsets facing each other, electrical contacts between neighboring pairs of said first subset are established by pairs of said second subset, and electrical contacts between neighboring pairs of said second subset are established by pairs of said first subset; and
(c) assembling and bonding the first and second substrates together, with said first and second subsets of said plurality of pairs of semiconducting members facing each other.

13. The method according to claim 12, wherein the applying of the first subset, the applying of the second subset, or the applying of both subsets, comprises printing or vapor depositing.

14. A method For generating a voltage or a heat gradient, comprising:
(i) exposing the thermoelectric device of claim 1 to a thermal gradient to generate a voltage, or
(ii) exposing the thermoelectric device of claim 1 to a voltage to generate a heat gradient.

15. The thermoelectric device according to claim 4, wherein the organic polymers are selected from the group consisting of poly(3-hexylthiophene), polyaniline, poly(phenylene vinylene)-disperse red 1, polysiloxane carbazole, polypyrrole, poly(o-anthranilic acid), poly(aniline-co-o-anthranilic acid) and poly(3,4-ethylenedioxythiophenc).

16. The thermoelectric device according to claim 7, wherein the insulating material is a glass.

17. The thermoelectric device according to claim 7, wherein the insulating material is a plastic.

18. The thermoelectric device according to claim 7, wherein the insulating material is a paper.

19. A medical device comprising the thermoelectric device of claim 1.

20. A laboratory device comprising the thermoelectric device of claim 1.

* * * * *